United States Patent
Kai et al.

[11] Patent Number: 5,963,821
[45] Date of Patent: Oct. 5, 1999

[54] METHOD OF MAKING SEMICONDUCTOR WAFERS

[75] Inventors: Fumitaka Kai; Masahiko Maeda; Kenji Kawate, all of Miyazaki, Japan

[73] Assignee: Komatsu Electronic Metal Co., Ltd., Kanagawa, Japan

[21] Appl. No.: 08/960,517

[22] Filed: Oct. 29, 1997

[30] Foreign Application Priority Data

Oct. 29, 1996 [JP] Japan .................................. 8-323259

[51] Int. Cl.⁶ .................. H01L 21/301; H01L 21/46; H01L 21/78
[52] U.S. Cl. .................. 438/460; 438/690; 438/691; 438/692; 438/928; 438/906; 438/959; 438/964; 438/974; 438/977
[58] Field of Search .................. 438/460, 690, 438/691, 692, 928, 906, 959, 964, 974, 977

[56] References Cited

U.S. PATENT DOCUMENTS 5,800,725  9/1998  Kato et al. .................. 216/88
5,821,167  10/1998  Fukami et al. .................. 438/691
5,827,779  10/1998  Masumura et al. .................. 438/691
5,851,924  12/1998  Nakazawa et al. .................. 438/691
5,899,743  5/1999  Kai et al. .................. 438/690

Primary Examiner—John F. Niebling
Assistant Examiner—David A. Zarneke
Attorney, Agent, or Firm—Sheridan Ross P.C.

[57] ABSTRACT

This invention provides a method for efficiently making semiconductor wafers having uniform thickness where the thickness of the back side does not influence the front side and where the front side of the wafer is capable of being distinguished from the back side. A semiconductor ingot is sliced to obtain wafers. The sliced surfaces of the wafers are flattened. The flattened wafer is etched in alkaline etching solution. Both the front and back sides of the etched wafer are polished using a double sided polishing apparatus so that the front side is a mirror surface and an unevenness remains on the back side to distinguish the front and back sides, thereof. The polished wafer is cleaned.

6 Claims, 6 Drawing Sheets

(a)

(b)

(c)

(d)

METHOD OF MAKING SEMICONDUCTOR WAFERS

FIELD OF THE INVENTION

This invention relates to a method of making semiconductor wafers which can distinguish front and back sides, thereof, by using a double sided polishing apparatus.

BACKGROUND OF THE INVENTION

Typically, during processing a device which prints a circuit on a semiconductor wafer, the back side of the semiconductor wafer is held by a vacuum chuck, and the front side is polished. The yield rate is decreased because the unevenness of the back side, which is chucked, influences the front side in the processing device. To solve this reduction in yield, the back side must also be polished. As such, both the front and back sides of the semiconductor wafers are simultaneously polished by using a double sided polishing apparatus.

However, problems often occur in the device process. For example, when the semiconductor wafer is polished on both the front and back sides, it becomes very difficult to distinguish the front from back side by visual inspection and sensors which are used to convey and position the water.

In JP 6-349795, a method of making semiconductor wafers is disclosed. The method maintains the yield rate during the circuit print of the device process, and the method prevents the problem of distinguishing the front from back sides of the wafer.

In the JP 6-349795 method, a sliced wafer 6 is chamfered (FIG. 7 (a)); the sliced surface 61 is flattened by lapping (FIG. 7 (b)); the lapped wafer 6 is etched with alkaline solution (FIG. 7 (c)); and the back side of wafer 6 is polished to remove most of the unevenness 64 which is formed by the alkaline etching. (FIG. 7 (d))

In the method, the front side of the wafer is polished to the mirror surface after polishing the back side. It is difficult to polish a semiconductor wafer that has uniform thickness because too much of the wafer is polished off at the periphery 65 due to polishing side by side, as shown in FIG. 7(e). In this method, since the wafers are necessarily polished in side by side processes, the manufacturing efficiency is not optimized.

When using a polishing block to polish the wafers, processes are required to adhere and remove the wafers from the polishing block. In this method, not only are the processes increased, but many chemicals are required to clean the wafers and the blocks.

SUMMARY OF THE INVENTION

The present invention is accomplished to solve the above problems. It is an object of the present invention to provide a method for efficiently making semiconductor wafers that have a uniform thickness, where the back side of the wafer does not influence the front side, thereof, and where the front and back sides of the wafer can be distinguished.

To achieve the above objects, in one embodiment, a method for making semiconductor wafers comprises the following steps; a semiconductor ingot is sliced to obtain wafers; the sliced surfaces of the wafers are flattened; the flattened wafers are etched in an alkaline etching solution; both the front and back sides of the etched wafers are polished by using a double sided polishing apparatus so that the front side has a mirror surface and an unevenness is maintained on the back sides to distinguish front and back sides, thereof; and the polished wafers are cleaned.

Further, in another embodiment, a method for making semiconductor wafers comprises the following steps; a semiconductor ingot is sliced to obtain wafers; the sliced surfaces of the wafers are flattened; the surfaces of flattened wafers are washed by an alkaline washing solution to remove the impurities from the damaged areas which were formed by the flattening step; both the front and back sides of the washed wafers are polished by using a double sided polishing apparatus so that the front side has a mirror surface and an unevenness is maintained on the back side to distinguish the front side from the back side, thereof; and the polished wafers are cleaned.

In the above prior art methods, the thickness of the processed semiconductor wafers were not uniform and the manufacturing process took a long time. An object of the present invention is to improve the subject matter of the prior art. To this regard, instead of polishing in a side by side manner, the present invention simultaneously polishes both the front and back sides of the wafers to obtain a uniform thickness and to shorten the polishing time. The double sided polishing of the present invention does not polish both the front and back sides of wafers to a mirror surface, but rather the front sides of wafers are polished to mirror surfaces while the back sides, thereof, are polished to produce an unevenness which is used to distinguish the front from the back side. The parameters of the double sided polishing apparatus are set to accomplish the above requirement.

Distinguishing the front and back sides by the unevenness of the back side is, typically, dependent upon the type of sensor used, the skill of those who visually distinguish the sides, the condition of lighting, and so on. For example, assuming the luster of perfect mirror surfaces is 100%, distinguishing the back side using a sensor requires the luster to be about 95% or less. Distinguishing the sides by visual inspection is enhanced using fluorescent lights.

The depth of the work damaged areas formed during the flattening step, such as a lapping process, is about 3 to 10 $\mu$m. At least 5 to 30 $\mu$m of thickness on one side are etched off by alkaline etching to remove the above-mentioned work damaged areas.

The peak-to-valley height of wafer surface after alkaline etching is about 1 to 3 $\mu$m. Therefore, more than this peak-to-valley height must be polished from the front side to obtain a mirror surface, and less than about 0.5 to 3 $\mu$m of thickness should be polished from the back side to obtain the above-mentioned luster.

DETAILED DESCRIPTION

A polishing method using double sided polishing apparatus is hereby described where the polishing rates of front and back sides of the wafer are different from each another. The luster of a mirror surface is assumed as 100% in this description.

The polishing, in at least one embodiment of the present invention, was conducted under the following conditions. The upper turntable turned in the opposite direction from the lower turntable. The internal gear and sun gear were rotated in the same direction as the lower turntable.

Diameter of wafers: 8 inches

The wafers were alkaline etched.

The peak-to-valley height: 3 $\mu$m

The upper turn table turning speed: 10 rev/min

The internal gear turning speed: 10 rev/min

The sun gear turning speed: 10 rev/min

The polish time: 20 minutes

Figure 5:
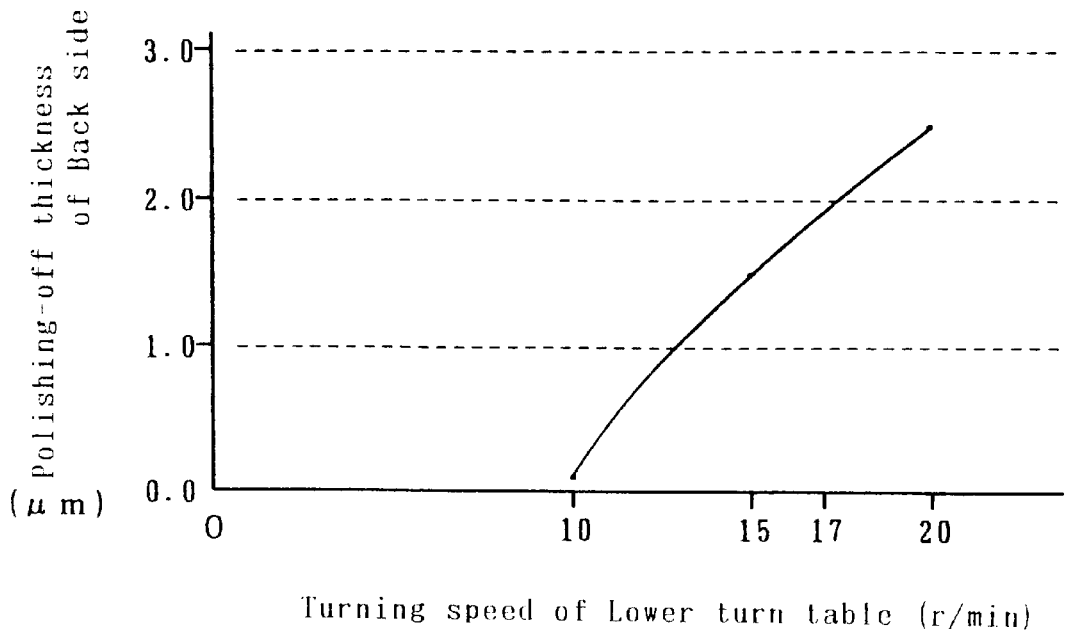
FIG. 5 is a graph which shows the relationship between the turning speed of the lower turn table and the polished-off thickness of the back side.
Figure 6:
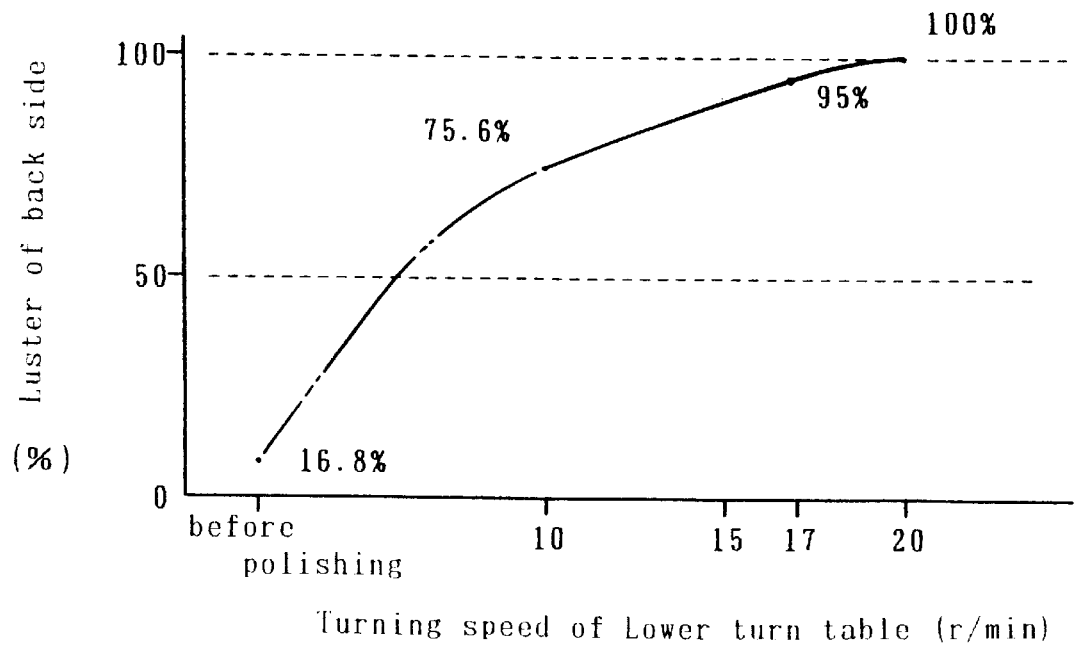
FIG. 6 is a graph which shows relationship between the turning speed of the lower turntable and the luster of the back side.
Figure 7:
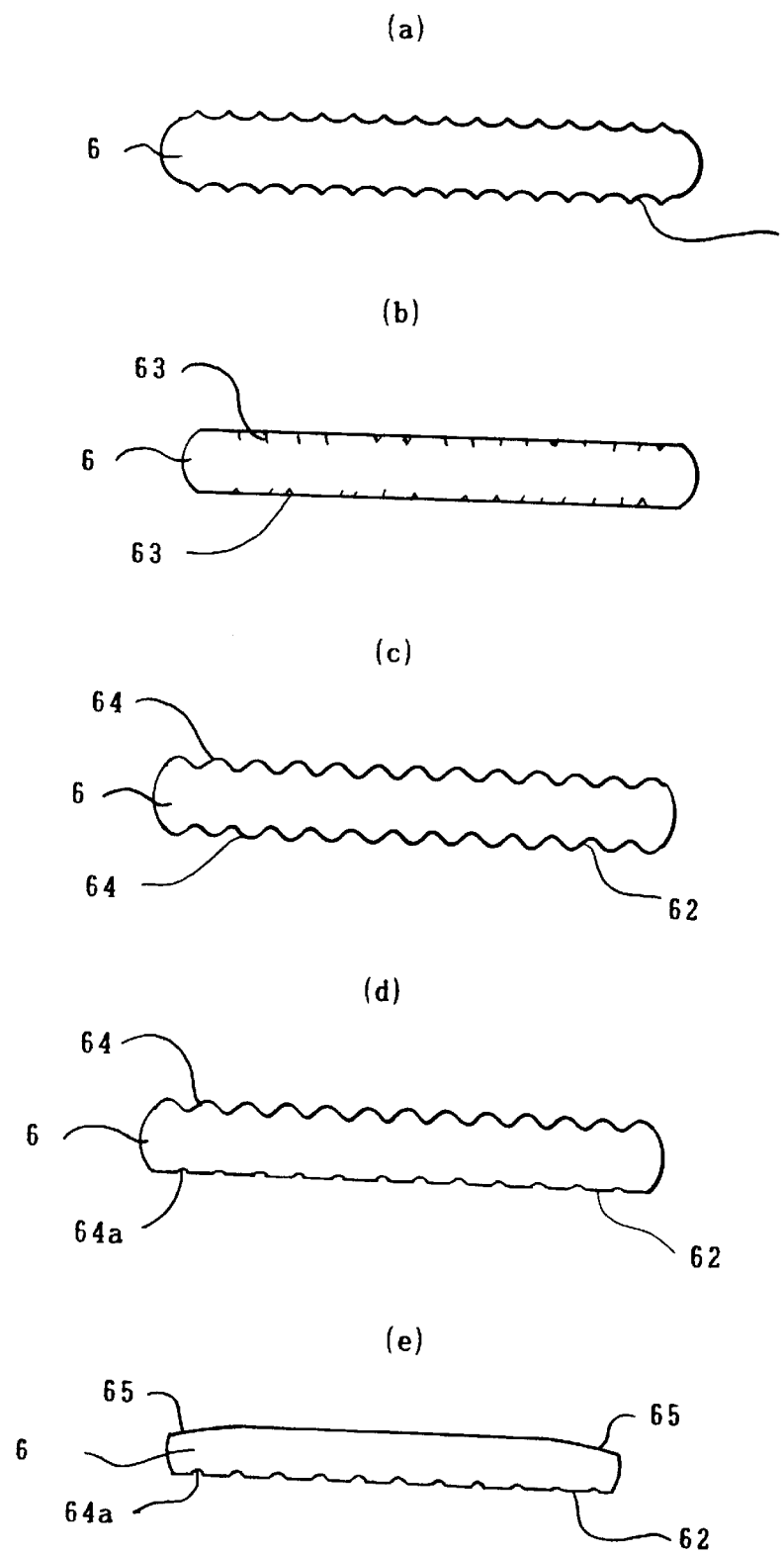
FIG. 7 illustrates sectional side elevations of the semiconductor wafers which are made by the method of the prior art.

Under these conditions, the turning speed of the lower turn table was varied within 10 to 20 rev/min, and the results as shown in FIG. 5 and FIG. 6 were obtained. The change in polished-off thickness and the changes in the luster of the back side of the wafer were analyzed. Incidentally, the polished-off thickness of the front side using the above settings was approximately 10 $\mu$m.

As shown in FIG. 5, the polished-off thickness of the back side reached 0.1 $\mu$m, which was the lowest thickness removed, when the turning speed of the lower turn table was 10 rev/min. As the gearing was changed and the turn speed of the lower turning table increased, the polished-off thickness increased. When the turning speed of the lower turn table was 20 rev/min, the polished-off thickness became 2.5 $\mu$m, which was the largest thickness removed.

Analyzing the luster as shown in FIG. 6, the luster was the lowest when the polished-off thickness was the smallest (0.1 $\mu$m) when the turning speed of the lower turn table was 10 rev/min, and as the polished-off thickness increasing the luster was also increasing.

Distinguishing the front and back sides by the above-mentioned sensor, a luster of about 95% or less is necessary. To obtain a luster in this range, the turning speed of the lower turn table ranged from 10 to 17 rev/min. As shown in FIG. 5, 0.1 to 1.9 $\mu$m of polished-off thickness was obtained from operating the turning speed of the lower turn table in this range. Consequently, the polished-off thickness of back side of the wafer ranges between 1% to 20% of the polished-off thickness of the front side.

Even though the polished-off thickness of front side was 10 $\mu$m in this embodiment and the peak-to-valley height of this embodiment was 3 $\mu$m, the luster becomes 100% when the polished-off thickness is approximately 2.5 $\mu$m, as shown in FIG. 5 and FIG. 6. Therefore, the front surface will surely be polished to a mirror surface if the polished-off thickness is 3 $\mu$m or more. On the other hand, to distinguish the front and back sides, the required luster of back side can be obtained by polishing-off 1.9 $\mu$m thickness or less. Therefore, it is possible to distinguish the front and back sides if ⅔ or less of the thickness polished-off from the front side is polished off the back side.

It is apparent that the polished-off thickness required to make a mirror surface will become smaller as the peak-to-valley height is decreased. Whereby, in order to obtain the above-mentioned distinguishable luster, a smaller peak-to-valley height will produce a smaller ratio of back side to front side polished-off thickness.

As stated above, when the peak-to-valley height is 3 $\mu$m or less, the ratio of back side to front side polished-off thickness is less than about ⅔. Usually, a peak-to-valley height of 1 to 3 $\mu$m is obtained after alkaline etching the wafer surface.

Incidentally, in the above embodiment, the double sided polishing apparatus was set so that the upper turn table turned in an opposite direction to the lower turn table, and the internal gear and the sun gear turned in the same direction as the lower turn table, whereby the polished-off thickness of back side was controlled by changing of lower turn table speed. However, it should be noted that the turning direction and speed setting of each turntable and each gear is not limited to the above-embodiment. The same object maybe achieved if the ratio of the polished-off thickness on the back side is controlled against the front side. By making the turning speed of the internal gear and the sun gear different, the uniformity of polishing is improved while rotating the polish carrier.

The polishing examples of the present invention are described herein.

EXAMPLE 1

Figure 1:
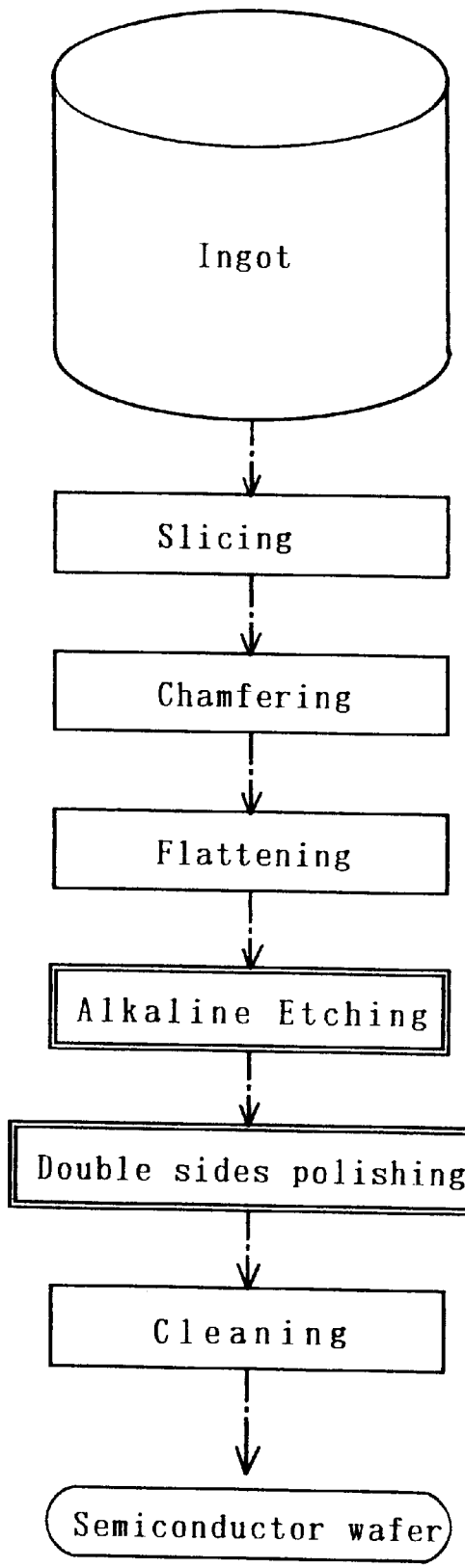
FIG. 1 is a flow chart of the method of making semiconductor wafers of Example 1.

As shown in FIG. 1, the method of Example 1 comprises the following steps.

Figure 2:
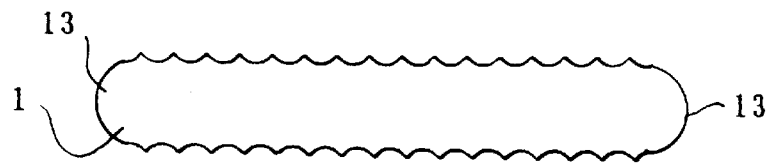
FIG. 2 illustrates sectional side elevations of the semiconductor wafers which are made by the method of Example 1.
Figure 2:
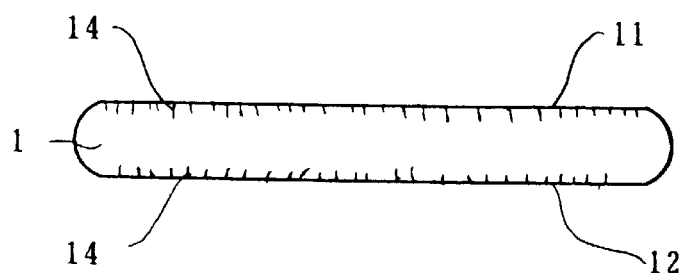
Figure 2:
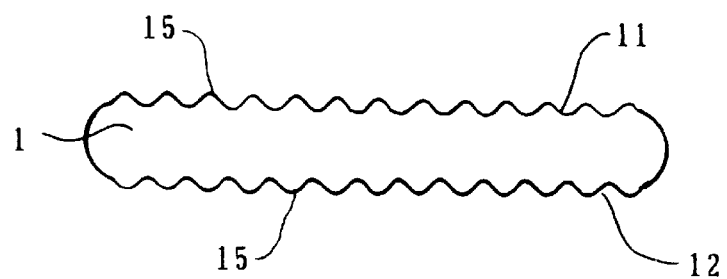
Figure 2:
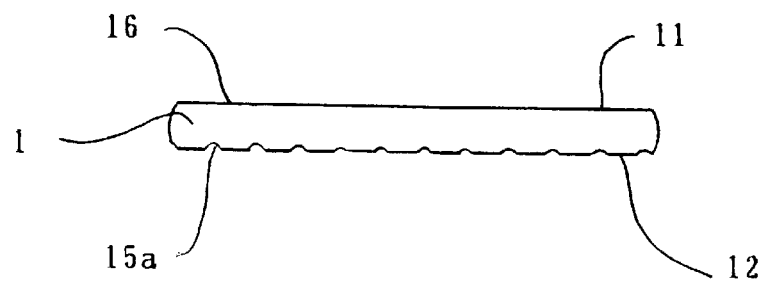

1. A semiconductor ingot was sliced to produce a wafer 1 (see FIG. 2 (a)).

2. The periphery 13 of sliced wafer 1 was chamfered (see FIG. 2 (a)).

3. The front side 11 and the back side 12 of chamfered wafer 1 were flattened by the lapping. During the lapping, process, work damaged areas 14 were produced on the front side 11 and the back side 12. (see FIG. 2 (b))

4. The lapped wafer 1 was alkaline etched. (see FIG. 2 (c)) A thickness of 20 $\mu$m was etched-off in about five minutes using an etching solution containing about 40% sodium hydroxide (NaOH), and the work damaged areas 14 which were formed by the lapping process were removed. A general flatness of whole surface of wafer 1 was attained by alkaline etching, however, an unevenness 15 of approximate 2.0 $\mu$m in peak-to-valley height is formed.

5. The etched wafer 1 was polished by using a double sided polishing apparatus. The upper turn table turned in an opposite direction to the lower turn table. The internal gear and the sun gear rotated in the same direction as the lower turn table. The condition of the polishing was set as previously mentioned, whereby, the front side of the wafer was polished by about 10 $\mu$m and the back side was polished by about 0.2 $\mu$m.

6. The double sided polished wafer 1 was cleaned. Thereby producing, a front side 11 having a mirror surface and unevenness 15a remained on the back side 12. The luster of the back side 12 produced during this example was about 80% (see FIG. 2 (d)). As such, the sensor could distinguish the back side 12 from the front side 11.

In Example 1, the wafers were etched for about 5 minutes using a solution of 40% NaOH. An etching time of about 1 to 15 minutes with a solution of 10 to 45% of NaOH is desirable for the alkaline etching step. Potassium hydroxide (KOH) and the other similar chemical solutions can also be used as an alkaline etching liquid.

EXAMPLE 2

In the method of Example 2, the work damaged areas produced by the flattening process are removed using the double sided polishing, thereby removing the etching process.

Figure 3:
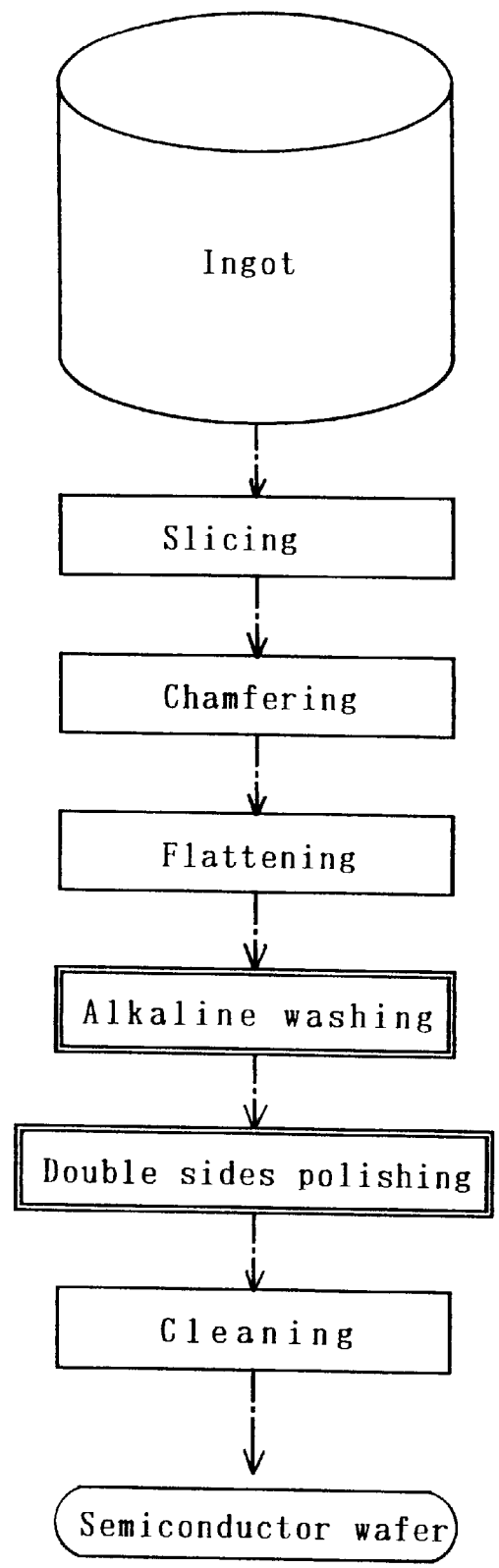
FIG. 3 is a flow chart of the method of making semiconductor wafers of Example 2.

As shown in FIG. 3, the method of Example 2 consists of the following steps.

1. A semiconductor ingot was cut into wafers 3.

Figure 4:
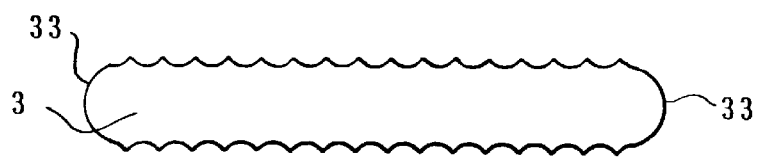
FIG. 4 illustrates sectional side elevations of the semiconductor wafers which are made by the method of Example 2.
Figure 4:
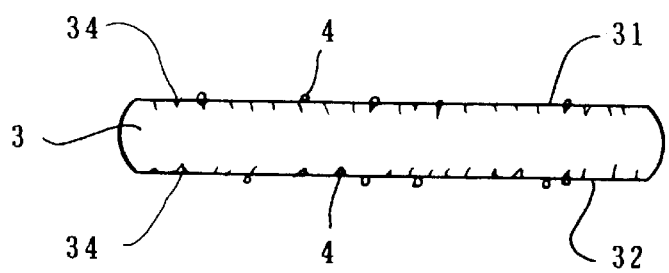
Figure 4:
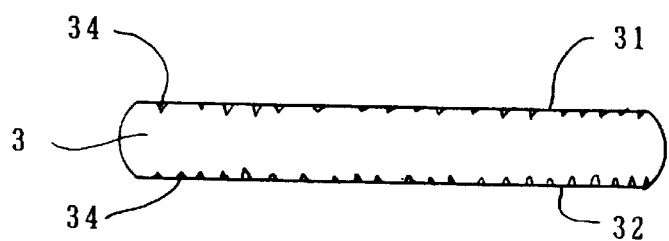
Figure 4:
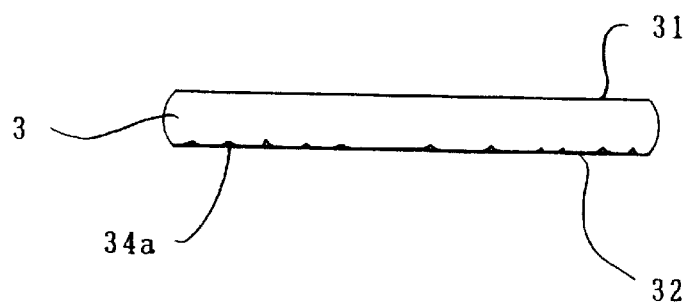

2. The periphery 33 of cut wafer 3 was chamfered. (see FIG. 4 (*a*))

3. Both the front and back sides 31 and 32 of chamfered wafer 3 were flattened by the lapping. (see FIG. 4 (*b*))

4. The lapped wafer 3 was alkaline washed to remove impurities 4, such as lapping particles and shavings, from the front side 31 and the work damaged areas 34.(see FIG. 4 (*c*)) The wafer 3 was washed with a 3% solution of NaOH for approximately 10 minutes.

5. The alkaline washed wafer 3 was polished using a double sided polishing apparatus. The upper turn table turned in the opposite direction from the lower turn table. The internal gear and the sun gear were rotated the same direction as the lower turn table. The polishing conditions were set as previously mentioned above. The front side of the wafer was polished by removing about 15 $\mu$m of thickness and the back side was polished removing approximately 0.5 $\mu$m of thickness.

6. The double sided polished the wafer 3 was cleaned. A semiconductor wafer was produced in which the front side 31 attained a mirror surface and having a small amount of work damaged areas 34*a* on the back side 32. (see FIG. 4 (*d*))

During the alkaline washing of Example 2, the wafer was washed for approximately 10 minutes using a 3% solution of NaOH. For the alkaline washing, it is desirable to wash for about 1 to 15 minutes with a solution of 0.1 to 10% NaOH.

Instead of using lapping a flattening process for each of the above-mentioned examples, substituting grinding for the flattening process can make similar semiconductor wafers. Moreover, in each of the above-mentioned examples, the double sided polishing of the wafer is done after the alkaline etching or the alkaline washing steps. Alternatively, a metal pollution removal process, involving washing the water with an acid solution, can be inserted between the alkaline etching, or the alkali wash process and the double sided polish process in order to improve the cleanliness of the semiconductor wafer surface.

Using the methods of the present invention, a semiconductor wafer can be efficiently manufactured in which the front and back sides can be distinguished using a sensor or by visual inspection. In addition, deterioration of the flatness caused by polishing one side then the other side is prevented.

The foregoing discussion of the invention has been presented for purposes of illustration and description. Further, the description is not intended to limit the invention to the form disclosed herein. Consequently, variation and modification commensurate with the above teachings, within the skill and knowledge of the relevant art, are within the scope of the present invention. The embodiment described herein and above is further intended to explain the best mode presently known of practicing the invention and to enable others skilled in the art to utilize the invention as such, or in other embodiments, and with the various modifications required by their particular application or uses of the invention. It is intended that the appended claims be construed to include alternative embodiments to the extent permitted by the prior art.

What is claimed is:

1. A method of making a semiconductor wafer comprising the following steps:

slicing a semiconductor ingot to obtain wafers having sliced surfaces;

flattening said sliced surfaces of said wafers to produce flattened wafers;

alkaline etching said surfaces of said flattened wafers to produce etched wafers;

polishing front and back sides of said etched wafers using a double sided polishing apparatus, wherein said front side attains a mirror surface and an unevenness is produced on said back side in order to distinguish said front side from said back side, thereof; and cleaning said polished wafer.

2. A method of making a semiconductor wafer, as claimed in claim 1, wherein:

said step of polishing removes a thickness on said back side that is ⅔ or less of a thickness removed from said front side.

3. A method of making semiconductor wafers, as claimed in claim 1, wherein:

an upper turntable is turned in an opposite direction to a lower turntable; and an internal gear and a sun gear are rotated in the same direction as said lower turntable so that a thickness polished-off from said back side is less than a thickness polished-off from said front side.

4. A method of making a semiconductor wafer comprising the following steps:

slicing a semiconductor ingot to obtain wafers having sliced surfaces;

flattening sliced surfaces of said wafers producing flattened wafers;

washing said surfaces of said flattened wafers with an alkaline washing solution to remove impurities from work damaged areas formed by said flattening step;

polishing front and back sides of the said washed wafer using a double sided polishing apparatus to remove said work damaged areas on said front side and producing a mirror surface on said front side, and using said double sided polishing apparatus to produce an unevenness on said back side to distinguish said front side from said back side, thereof; and cleaning said polished wafer.

5. A method of making a semiconductor wafer, as claimed in claim 4, wherein:

said step of polishing removes a thickness on said back side that is ⅔ or less of a thickness removed from said front side.

6. A method of making semiconductor wafers, as claimed in claim 4, wherein:

an upper turntable is turned in an opposite direction to a lower turntable; and an internal gear and a sun gear are rotated in the same direction as said lower turntable so that a thickness polished-off from said back side is less than a thickness polished-off from said front side.

* * * * *